United States Patent
Babel et al.

(10) Patent No.: US 8,606,546 B2
(45) Date of Patent: Dec. 10, 2013

(54) SENSOR FOR A MEASURING POINT AND METHOD FOR TESTING A SENSOR FOR A MEASURING POINT

(75) Inventors: Wolfgang Babel, Weil der Stadt (DE); Martin Gehrke, Weinstadt (DE); Detlev Wittmer, Maulbronn (DE); Andreas Gommlich, Karlsruhe (DE)

(73) Assignee: Endress + Hauser Conducta Gesellschaft für Mess- und Regeltechnik mbH + Co. KG, Gerlingen (DE)

(*) Notice: Subject to any disclaimer, the term of this patent is extended or adjusted under 35 U.S.C. 154(b) by 0 days.

(21) Appl. No.: 13/613,114

(22) Filed: Sep. 13, 2012

(65) Prior Publication Data

US 2013/0013258 A1    Jan. 10, 2013

Related U.S. Application Data

(63) Continuation of application No. 12/226,621, filed as application No. PCT/EP2007/053609 on Apr. 13, 2007, now Pat. No. 8,285,518.

(30) Foreign Application Priority Data

Apr. 26, 2006 (DE) .......................... 10 2006 020 016
Apr. 28, 2006 (DE) .......................... 10 2006 020 341
Jun. 21, 2006 (DE) .......................... 10 2006 028 826

(51) Int. Cl.
*G06F 15/00* (2006.01)

(52) U.S. Cl.
USPC .......................................................... 702/188

(58) Field of Classification Search
USPC .......................................................... 702/188
See application file for complete search history.

(56) References Cited

U.S. PATENT DOCUMENTS

| | | | |
|---|---|---|---|
| 5,597,534 A | 1/1997 | Kaiser | |
| 6,182,497 B1 | 2/2001 | Krajci | |
| 6,294,997 B1 | 9/2001 | Paratore | |
| 7,587,953 B2 * | 9/2009 | Wittmer | ............. 73/866.1 |
| 2005/0022581 A1 | 2/2005 | Sunshine | |
| 2006/0291856 A1 | 12/2006 | Hampel | |

FOREIGN PATENT DOCUMENTS

| | | |
|---|---|---|
| DE | 197 22 744 A1 | 12/1998 |
| DE | 198 49 293 A1 | 4/2000 |
| DE | 201 07 113 U1 | 8/2001 |
| DE | 100 32 864 A1 | 1/2002 |
| DE | 100 32 864 B4 | 1/2002 |
| DE | 102 41 241 B4 | 4/2004 |
| DE | 103 13 639 A1 | 10/2004 |
| DE | 103 44 262 A1 | 4/2005 |
| WO | WO 2005/031339 | 4/2005 |

* cited by examiner

*Primary Examiner* — Bryan Bui
(74) *Attorney, Agent, or Firm* — Bacon & Thomas, PLLC

(57) ABSTRACT

A two-part sensor composed of a sensor head and a sensor-head counterpart, testing is performed as to whether a correct sensor head is connected with the sensor-head counterpart.

6 Claims, 2 Drawing Sheets

SENSOR FOR A MEASURING POINT AND METHOD FOR TESTING A SENSOR FOR A MEASURING POINT

CROSS-REFERENCE TO RELATED APPLICATION

This application is a Continuation Application which claims the benefit of U.S. patent application Ser. No. 12/226,621, which was filed on Aug. 4, 2009.

TECHNICAL FIELD

The invention relates to a sensor for a measuring point and to a method for testing a sensor for a measuring point.

BACKGROUND DISCUSSION

In process automation technology, sensors are frequently applied, to serve for registering values of measured variables. As a rule, the sensors are connected via a measurement transmitter with a control system, to which the measurement data is forwarded. Communication between the measurement transmitters and the control system is accomplished according to one of the standards usual in process automation technology, such as e.g. HART data transmission or a field bus system (Foundation fieldbus, Profibus, etc.). Besides these open transmission systems, also sometimes applied in the case of digital data transmission are proprietary protocols, this especially being true in the case of peer-to-peer combinations between sensor and measurement transmitter.

In the case of certain sensor types, the sensors are often constructed of two components, a sensor head and a sensor-head counterpart fitting the sensor head. The sensor-head counterpart provided at a measuring point is fixedly connected with the measurement transmitter, while the sensor head can be removed. This dividing in two is especially advantageous in the case of sensors that must be regularly subjected to maintenance.

For cleaning or calibrating, the sensor head can be simply removed at the measuring point, in order then to be transported to a laboratory, where maintenance is performed.

Such a two-part sensor is available from the applicant (Endress+Hauser Conducta) under the mark Memosens®. This product has been manufactured and sold for a number of years by the applicant.

Problematic in the case of such sensors is that, after the cleaning or calibration, the right sensor head must be re-installed onto the sensor-head counterpart at the right measuring point. Frequently, the user carries a box containing a set of several sensor heads, out of which the right sensor head for the measuring point of concern must be selected. For this, the sensor heads are labeled with the measuring point designation (TAG-Name), in order to facilitate, for the user, the association of sensor head with measuring point.

Due to the manual activity of the user, however, mix-ups are still possible. A mismatch can have serious consequences. Thus, a measuring head, which was installed at a cyanide measuring point, must, under no circumstances, be installed at a foods measuring point.

A wrongly applied measuring head can lead e.g. to contamination of the product being measured and, therewith, to serious degradation of following processing steps of the product.

Currently, applications are known, where sensor and measurement transmitter are located relatively far from one another. In the future, it is planned that sensors will be able to be connected directly with the control system, without the interposing of a measurement transmitter.

A wrongly applied sensor head can, in principle, be indicated on the measurement transmitter or on the control system. When sensor and measurement transmitter or control system are separated relatively widely spatially, however, such a display directly at the measuring point is not possible To check in the case of each replacement, the user would have to travel relatively long paths. This kind of checking is, moreover, extremely time consuming in the case of sets of, perhaps, 20 sensor heads, since the user must return to the control system a number of times, in order to check whether a correct sensor head has been installed.

All previously known methods of checking are burdened with possible sources of error, so that absolutely reliable installation of the sensor heads at their correct measuring points is not assured.

In the future, replacement of measuring heads should be a routine activity, which need not necessarily be performed by technicians. In this way, still higher requirements are placed on effecting safe replacement.

SUMMARY OF THE INVENTION

An object of the invention is, therefore, to provide a sensor for a measuring point and a method for testing a sensor for a measuring point, one of which or both of which does/do not have the above mentioned disadvantages, and wherein, especially, a safe replacement of measuring heads is assured for sensors, and the user receives, directly signaled, an error report in the case of installation of a wrong sensor head.

This object is achieved by a sensor including a sensor head and a sensor-head counterpart which are releasably connectable together. A control system is provided which is connected to the sensor-head counterpart and to which processed, measured values from the sensor head are forwarded. The sensor head includes a measuring transducer for measured value registering, a first microcontroller for measured value processing, a voltage supply unit for energy supply of the sensor head, and a communication interface for data exchange with the sensor-head counterpart. The first microcontroller is connected with a radio unit which is connected to the voltage supply unit and which has an additional, separate voltage supply unit, which is fed via radio wave energy and thereby enables a data-exchange via radio, and also when the voltage supply unit delivers no energy for the sensor head; and by a method comprising the steps of: reading an identification of the sensor head via a first radio path into a portable testing device; transmitting the identification from the testing device to the control system via a second radio path; transmitting measuring-point-specific data from the control system to the testing device; and displaying the measuring-point-specific data on the testing device.

BRIEF DESCRIPTION OF THE DRAWINGS

The invention will now be explained in greater detail on the basis of an example of an embodiment presented in the drawing, the figures of which show as follows.

DETAILED DISCUSSION

Figure 1:
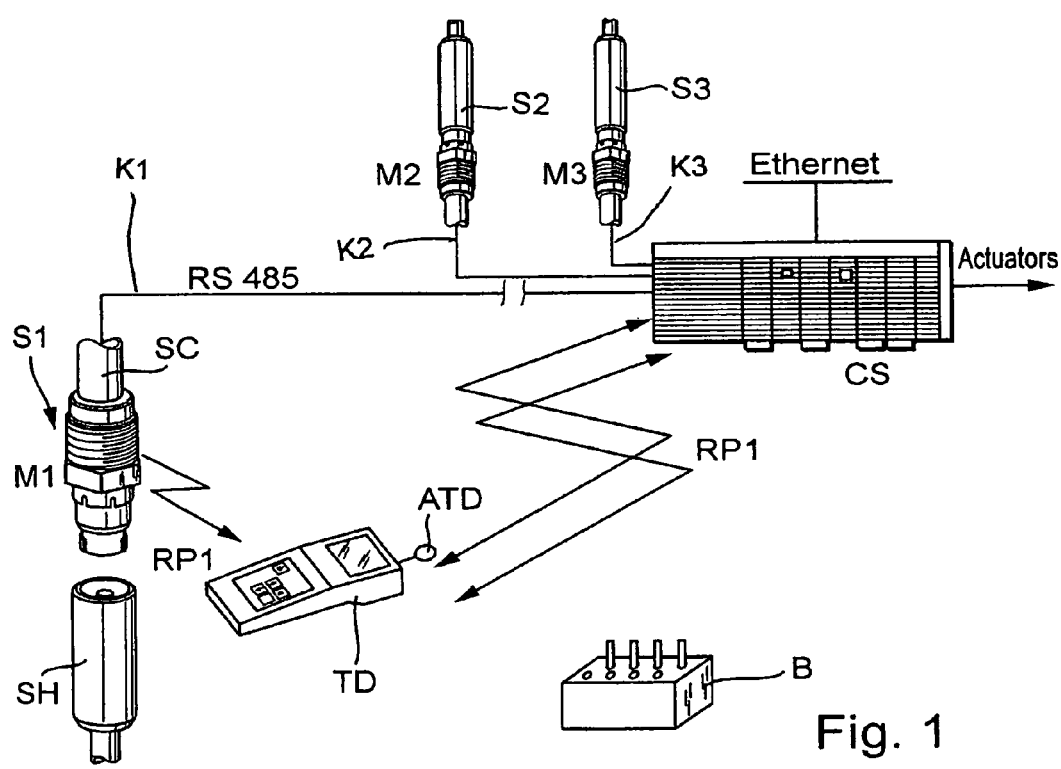
FIG. 1 a schematic drawing of a plurality of sensors connected with a control system.

FIG. 1 shows a control system CS, to which a plurality of sensors S1, S2, S3 is connected via corresponding cables K1, K2, K3. Sensors S1, S2, S3 are, in each case, associated with suitable measuring points M1, M2, M3. Communication between the sensors and the control system is accomplished via serial data communication with a physical layer according to the RS 485 standard. Also connected with the control system CS are actuators (not shown in greater detail). Control system CS can be a PLC-unit (programmable logic controller) or a decentralized control DCS (Distributed Control System). Frequently, the control system CS is also connected to a local network (Ethernet), which enables a plant- or company-wide exchange of data.

Figure 2:
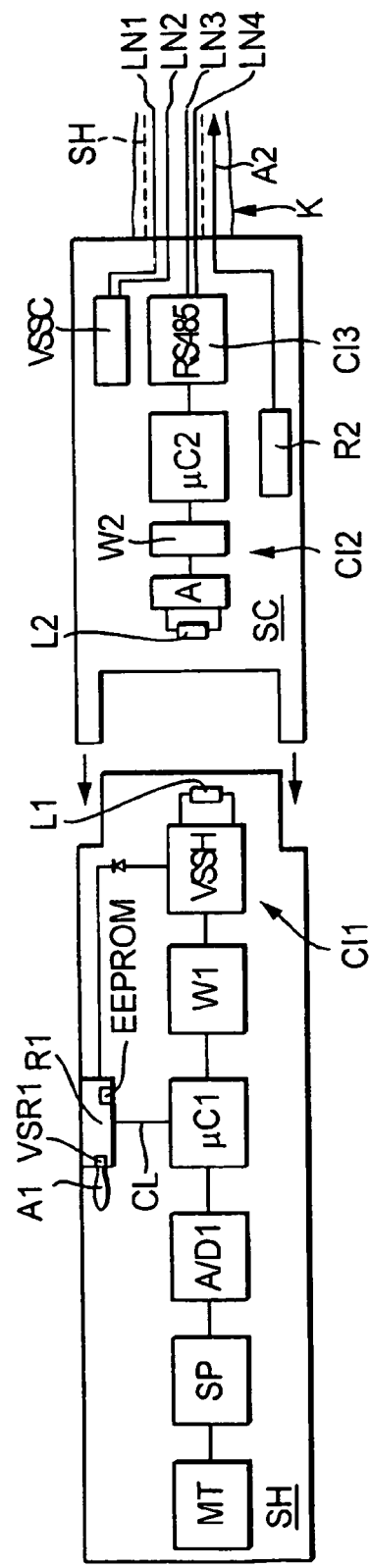
FIG. 2 a schematic drawing of a two-part sensor with sensor head and sensor-head counterpart.

FIG. 2 is a block diagram of a sensor of the invention. The sensor is made of two components, a sensor head SH and a sensor-head counterpart SC. The two components are connected with one another via a simple-to-release, bayonet connection.

The sensor head SH is composed, essentially, of a measuring transducer MT, which serves for registering a physical, measured variable e.g. pH-value, temperature, etc. Connected to the measuring transducer MT is a signal processing unit SP, in which the measurement signal is preprocessed, e.g. filtered or amplified. Via an analog/digital converter A/D 1, the measurement signal is then fed to a microcontroller μC1, in which a further processing of the measuring signal takes place. Via a communication interface CI1, the microcontroller μC1 can transmit and receive data. The communication interface CI1 is composed of a converter W1, a voltage supply unit VSSH and a coil L1. Formed to fit the sensor head SH is a sensor-head counterpart SC. The two are connectable with one another for easy release via a bayonet connection (not shown in greater detail).

The sensor-head counterpart SC contains a communication interface CI2 appropriate for communication with interface CI1. Communication interface CI2 includes a coil L2, an amplifier A and a converter W2. The converter W2 is connected with a microcontroller μC2. Communication with the control system CS is accomplished hardwired via a communication interface CI3, which is provided e.g. by an RS-485 chip. Cable K has 4 lines LN1, LN2, LN3, LN4, which are surrounded by shielding SH. Two lines are provided for communication and two lines for energy transmission for sensor-head counterpart SC. Thus, for energy supply of the sensor-head counterpart SC, a voltage supply unit VSSC is provided, which is supplied via the lines LN1 and LN2 from the control system CS.

The construction described to this point reflects the known, Memosens sensor.

Data transmission between the two communication interfaces CI1 and CI2 is accomplished via an inductive coupling. Simultaneously via this connection, also energy is transmitted wirelessly to the sensor head SH. This energy is converted in the voltage supply unit VSSH into a supply voltage or voltages appropriate for the individual components.

Transferred between control system CS and the sensor (sensor-head counterpart and/or sensor head) are various items of measurement data, parameter data and sensor-specific data, e.g. sensor identification with serial number, production data, hardware- and software-versions, measured values, including main measured value and auxiliary measured value(s) (as a rule, temperature), calibration data with offset/slope, date/time, calibration method, sensor state, including remaining service life under extreme conditions, calibration cycles, help parameters for evaluating condition, information concerning the measuring point, such as TAG-number, information concerning the sensor element on the sensor head, such as measurement range, date when first placed in use, charge, or batch.

In the case of the described example of an embodiment, sensor head SH and sensor-head counterpart SC are completely galvanically separated. This galvanic separation is of great advantage, especially in the case of pH-measurement; however, for the present invention, galvanic separation is not necessarily required.

For calibration, the sensor head SH is screwed off, or otherwise released, from the sensor-head counterpart SC and transported to a laboratory remote from the measuring point M1, where the actual calibrating takes place. This can be done with automation and the calibration values for each sensor head stored uniquely associably in a database. This database can e.g. also be connected to the local network. Afterwards, the sensor head must be re-installed at the measuring point, from which it was removed. The user can typically be provided, for the removal and re-installation, with a box B capable of containing a number of sensor heads. Such a box B is shown, very stylized, in FIG. 1.

According to the invention, the sensor head SH includes an antenna A1 and a radio unit R1 connected thereto. The radio unit R1 can either be connected with the microcontroller μC1 via the connecting line CL, or, in an alternative embodiment, can have no connection to the microcontroller μC1. The radio unit R1 is a transponder, such as is often used in RFID-technology. Radio unit R1 is designed so that it can work without a foreign energy supply, but, instead, only with the aid of radio wave energy.

Supplementally, the radio unit R1 is also connected with the voltage supply unit VSSH. In this way, data can also be read out of a memory (EEPROM-memory with 512 byte memory capacity) provided in the radio unit R1, when no radio wave energy is available.

Furthermore, provided in the sensor-head counterpart SC is a radio unit R2, which is connected with the microcontroller μC2. The antenna A2 of the radio unit R2 is provided in the cable K outside of the shielding SH.

Operation of the sensor will now be explained in greater detail for various alternative embodiments.

The sensor head SH is not connected with the sensor-head counterpart. At the measuring point M1, the user can, before connecting the sensor head SH, obtain, with the help of a portable testing device TD, data from the still not assembled sensor S1. For this, the portable testing device TD asks for, or queries, the identification of the sensor head SH, such being stored in the memory EEPROM of the radio unit R1. The energy supply of the radio unit is accomplished in the case of this query via the radio path (first radio path RP1). The identification is then transmitted to the control system CS via a second, longer radio path RP2. On the basis of the identification, the control system CS ascertains the measuring point, for which this sensor head SH is provided. Then, measuring-point-specific data are transmitted to the testing unit TD and displayed thereon. This data helps the user install the right sensor head SH at the correct measuring point, here the measuring point M1.

Following this, again the identification of the sensor head SH is read out by the testing device TD, as described above, On the basis of the identification, the control system CS ascertains the appropriate measuring point M1 for which the sensor head SH is provided. Now, the control system CS queries the corresponding measuring point M directly via the cable connection, and ascertains, so, the identification of the sensor head SH actually installed at this measuring point M1. When the sensor head SH has been installed at the right measuring point, then the identification transmitted to the control system CS by the testing device TD and the identification ascertained by the control system CS must agree. If the two identifications agree, then an appropriate report of correctness ("measuring point OK") is sent by the control system CS to the testing device TD. This information is directly displayed to the user at the measuring point M1. Therewith, the user sees, immediately, that the right sensor head was installed at this measuring point.

In case a wrong sensor head was installed, then the two identifications do not agree, and the control system CS sends, in this case, an appropriate error report ("wrong sensor head") to the testing device TD. In this way, an erroneous use of a sensor head at a measuring point is simply and reliably prevented. The user sees, thus, directly after the installation, whether the right sensor head has been installed at the provided measuring point.

For the case, in which the sensor S1 is arranged in a metal container, only the end of the sensor-head counterpart still protrudes out of the container after the installation. A communication between radio unit R1 and the testing device TD, the latter being outside of the container, is now no longer possible.

In this case, radio unit R2 comes into use. Communication is accomplished now between testing device TD and radio unit R2. Radio unit R2 asks via the microcontroller μC2 for the identification of the sensor head from the sensor head SH. The read-out of the identification out of the EEPROM-memory of the radio unit R1 is possible, since the radio unit R1 can communicate directly with the microcontroller μC1, which is supplied via the voltage supply unit VSSH. Since the sensor head SH protrudes into a metal container, no radio wave energy can be transmitted to the radio unit R1 due to the shielding. In this case, the user can identify the sensor head also in the installed state.

If a number of measuring points M1, M2, M3 are arranged relatively near to one another, then the problem arises, that the testing device TD can be in contact with radio units of different measuring points. The user is, in this case, not quite sure, with which measuring point the testing device TD is actually communicating. The information "measuring point OK" could, in principle, come also from a neighboring measuring point and not the measuring point, which the user actually wants to test. For this reason, the testing device includes, according to the invention, a pliers-like antenna ATD, which must be closed around the antenna A2 of a sensor, in order to enable communication with exactly that sensor. In this way, the user can be sure, that the testing of the correct measuring point with the sensor S1 located directly in front is being accomplished. Mix-ups are, thereby, absolutely excluded.

The invention is suited not only for the replacement of sensor heads but, instead, also for the first-time installation. In this case, it must only be assured, that the measuring point and the identification of its suitable sensor head are already stored in the control system CS.

The testing device TD is, in principle, designed for two different radio communication methods: On the one hand, communication with the radio unit R1 according to RFID-technology, and, on the other hand, with the radio unit R2 or the control system CS, for example, according to the ZigBee-standard.

In the following, there is no connection via the connecting line CL between radio unit R1 and microcontroller μC1. A unique ID (identification) is stored in the radio unit R1 and in the microcontroller μC1. In the production of the sensor head SH, it must be assured, that the ID is the same in both components.

Via this unique ID-identification, the serial number of the sensor head SH can be ascertained and, therewith, data for the relevant sensor head can be accessed in a database. The database can be stored e.g. directly in the testing device TD. If this is not the case, then, alternatively, database query can also occur via the radio path RP2. In each case, sensor data, e.g. the measured value, can also be read out of the sensor directly via the radio unit R1 or R2.

For the user, there is additional safety, in that query of the measured value can be done on-site with the help of the testing device TD query and then this can be checked in the control room. If the two values agree, there is added certainty.

In the following, all cases of application of the invention will again be systematically indicated. The invention concerns, in general, communication with a sensor via the first radio path RP1. In such case, two methods are observed: 1. Communication with the radio unit R1 and supplying the radio unit R1 with power, or energy, from the radio field; and 2. communication, via a short-range radio technology (for example Zigbee, Nanonet among others), with the radio unit R2 in the sensor-head counterpart SC.

For communication according to the first method, there are different cases of application: 1. The radio unit R1 has no connection to the microcontroller μC1 or to the voltage supply unit VSSH. Particular sensor data are stored in the EEPROM and only accessible via the microcontroller μC1. In such case, the following special cases are thinkable:

1.1 The sensor is in the box B and not connected with the sensor-head counterpart SC. An identification of the sensor (unique ID) is queried from the sensor head SH, with supply from the radio field. The unique ID is transformed into a measuring point number or sensor number by a database provided in the testing device TD. With this information, an inquiry to the control system CS as to the correctness of the measuring point can occur via the second radio path RP2. Alternatively, in this connection, a direct inquiry as to correctness of use can occur at the control system CS via the second radio path RP2 using the unique ID. Display of the answer is effected on the testing device TD via the second radio path RP2.

1.2 Now, the case is considered, wherein the sensor is connected to the cable K via the sensor-head counterpart SC and no shielding from a retractable assembly is present. In this case, again, an identification of the sensor (unique ID) is queried from the sensor head SH, with supply from the radio field. The unique ID is turned into the measuring point number using a database in the testing device TD. Then, an inquiry for sensor data and also measured values is made to the control system CS via the second radio path RP2. Alternatively, a direct inquiry for sensor data (also measured values) can occur at the control system CS via the second radio path RP2 using the unique ID. Display of the answer is accomplished on the testing device TD via the second radio path RP2.

1.3 A third alternative results, when the sensor is connected to the cable via the plug counterpart SC, but a shielding of the first radio path RP1 is provided by the retractable assembly. In this case, a query of the sensor data is possible over the first radio path via antenna A2 and radio unit R2. The query is channeled to the sensor head SH via the microcontroller μC2 into the data stream coming from the communication interface CI3/LN3/LN4 via the converter W2 and the amplifier V as well as the coil L2. The answer is channeled out from the sensor head SH by the microcontroller μC2 and the answer is transmitted via the radio unit R2 and the antenna 2 to the testing device TD. Then, display of the answer is accomplished on the testing device TD, via the first radio path RP1, by the radio unit R2.

Now, the second case of application will be considered.

2. In this case, radio unit R1 has an electrical connection to microcontroller μC1 via the connecting line CL and also a connection to the data memory EEPROM and to the voltage supply unit VSSH. Also here, again, the following particular cases of application are possible:

2.1 The sensor is located in the box B and is not connected to the cable via the sensor-head counterpart SC. Query of the sensor data occurs directly out of the EEPROM of the sensor head SH, as part of the radio unit R1. Power supply is accomplished by the radio field. Then, display of the answer occurs on the testing device TD via the first radio path RP1.

2.2 In an additional special case, the sensor is connected to cable K via the sensor-head counterpart SC, and there is no shielding by a retractable assembly. The query of the sensor data and the measured values is accomplished directly out of the EEPROM and the microcontroller μC1 of the sensor head SH, as part of the radio unit R1. Also here, again, supply is by the radio field. Display of the answer is accomplished via the first radio path RP1 onto the testing device TD. Special case 2.3 corresponds to case 1.3.

The invention claimed is:

1. A sensor for a measuring point, comprising:
    a sensor head;
    a sensor head counterpart, said sensor head and sensor head counterpart being releasably connected with one another via a plug connection, and a control system connected with said sensor head counterpart;
    said sensor head including a measuring transducer for measured value registering, a first microcontroller for measured value processing, and a first communication interface for data exchange with said sensor head counterpart, said sensor head counterpart including a second microcontroller, and a second communication interface for data exchange with said sensor head;
    wherein communication of said sensor head counterpart with said control system is accomplished hardwired via a further communication interface of said sensor head counterpart;
    wherein energy is transmitted from said sensor head counterpart to said sensor head,
    said sensor head counterpart including a radio unit connected to said second microcontroller.

2. The sensor as claimed in claim 1, said sensor head further including a voltage supply unit for energy supply of said sensor head.

3. The sensor as claimed in claim 2, wherein:
    said sensor head counterpart is adapted to receive a query over said radio unit and to channel said query to said sensor head via said second microcontroller, said second and said first communication interface; and
    wherein said sensor head counterpart is further adapted to channel an answer of said sensor head to the query via said first and second communication interface to said second microcontroller and to transmit said answer via said radio unit.

4. The sensor as claimed in claim 3, wherein:
    energy transmitted to the sensor head is converted in the voltage supply unit into a supply voltage.

5. The sensor as claimed in claim 1, wherein:
    data exchange between said sensor head and said sensor head counterpart occurs wirelessly across said plug connection and energy supply of said voltage supply unit of said sensor head occurs wirelessly likewise across said plug connection.

6. The sensor as claimed in claim 1, wherein:
    data transmission between said first and second communication interface is accomplished via an inductive coupling, and simultaneously via this connection, said energy is transmitted wirelessly to said sensor head.

* * * * *